United States Patent
Kim et al.

(10) Patent No.: US 8,969,143 B2
(45) Date of Patent: Mar. 3, 2015

(54) SEMICONDUCTOR PACKAGE AND METHOD OF MANUFACTURING THE SAME

(71) Applicant: Samsung Electronics Co., Ltd., Gyeonngi-do (KR)

(72) Inventors: Daniel Kim, Suwon-si (KR); Jae-sung You, Suwon-si (KR); Jong-kil Park, Suwon-si (KR)

(73) Assignee: Samsung Electronics Co., Ltd., Seoul (KR)

( * ) Notice: Subject to any disclaimer, the term of this patent is extended or adjusted under 35 U.S.C. 154(b) by 0 days.

(21) Appl. No.: 13/961,258

(22) Filed: Aug. 7, 2013

(65) Prior Publication Data

US 2013/0316479 A1    Nov. 28, 2013

Related U.S. Application Data

(62) Division of application No. 13/234,971, filed on Sep. 16, 2011, now Pat. No. 8,513,680.

(30) Foreign Application Priority Data

Dec. 21, 2010 (KR) ........................ 10-2010-0131667

(51) Int. Cl.
*H01L 21/20* (2006.01)
*H01L 33/60* (2010.01)
(Continued)

(52) U.S. Cl.
CPC ............... *H01L 33/60* (2013.01); *H01L 33/62* (2013.01); *H01L 33/486* (2013.01); *H01L 2224/48091* (2013.01); *H01L 2224/48247* (2013.01); *H01L 2224/48257* (2013.01)
USPC ...... 438/141; 438/91; 438/780; 257/E21.006; 257/E21.007; 257/E21.053; 257/E21.352; 257/E21.499; 257/E21.502; 257/E21.508; 257/E21.511

(58) Field of Classification Search
USPC ............. 438/106, 91, 70, 122, 141, 602, 603, 438/604, 780, 687, 688, 104, 611, 612; 257/E21.006, E21.007, E21.053, 257/E21.352, E21.499, E21.502, E21.508, 257/E21.511
See application file for complete search history.

(56) References Cited

U.S. PATENT DOCUMENTS 6,617,617 B2  9/2003  Takekuma et al.
6,858,869 B2  2/2005  Fujiwara
(Continued)

FOREIGN PATENT DOCUMENTS

JP    2007-184643 A    7/2007
JP    2010-103243 A    5/2010
(Continued)

OTHER PUBLICATIONS

Entire Prosecution History of U.S. Appl. No. 13/234,971, filed Sep. 16, 2011, entitled Semiconductor Package and Method of Manufacturing the Same.

*Primary Examiner* — David Nhu
(74) *Attorney, Agent, or Firm* — McDermott Will & Emery LLP

(57) ABSTRACT

A light-emitting device package including a lead frame formed of a metal and on which a light-emitting device chip is mounted; and a mold frame coupled to the lead frame by injection molding. The lead frame includes: a mounting portion on which the light-emitting device chip is mounted; and first and second connection portions that are disposed on two sides of the mounting portion in a first direction and connected to the light-emitting device chip by wire bonding, wherein the first connection portion is stepped with respect to the mounting portion, and a stepped amount is less than a material thickness of the lead frame.

10 Claims, 5 Drawing Sheets

(51) Int. Cl.
*H01L 33/62* (2010.01)
*H01L 33/48* (2010.01)

(56) References Cited

U.S. PATENT DOCUMENTS

| | | | |
|---|---|---|---|
| 6,922,424 B2 | 7/2005 | Weigert et al. | |
| 6,936,855 B1 | 8/2005 | Harrah | |
| 7,276,739 B2 | 10/2007 | Chen et al. | |
| 7,381,996 B2 | 6/2008 | Hsin Chen | |
| 7,763,478 B2 * | 7/2010 | Loh et al. | 438/22 |
| 8,232,574 B2 * | 7/2012 | Ng et al. | 257/98 |
| 8,513,680 B2 * | 8/2013 | Kim et al. | 257/79 |
| 8,530,918 B2 * | 9/2013 | Jang | 257/98 |
| 2006/0091410 A1 | 5/2006 | Chen | |

FOREIGN PATENT DOCUMENTS

| | | |
|---|---|---|
| KR | 10-2007-0055361 | 5/2007 |
| KR | 10-2008-0018096 | 2/2008 |

* cited by examiner

SEMICONDUCTOR PACKAGE AND METHOD OF MANUFACTURING THE SAME

CROSS-REFERENCE TO RELATED APPLICATIONS

This application is a Divisional of U.S. application Ser. No. 13/234,971, filed on Sep. 16, 2011, now U.S. Pat. No. 8,513,680, which claims the benefit of Korean Patent Application No. 10-2010-0131667, filed on Dec. 21, 2010, in the Korean Intellectual Property Office, the disclosures of which are incorporated herein in-their entirety by reference.

BACKGROUND

1. Field

The present disclosure relates to light-emitting device packages in which a light-emitting device chip is packaged using a lead frame and a mold, and methods of manufacturing the light-emitting device packages.

2. Description of the Related Art

Light-emitting device chips such as light-emitting diodes (LED) refer to semiconductor devices capable of reproducing various colors of light by including a light-emitting source via PN junctions of a compound semiconductor. A LED has a long lifetime, is compact and lightweight, and has an intense light directivity and can be driven at a relatively low voltage. Also, a LED is resistant to impact and vibration, does not require a preheating time or complicated driving operations, and can be packaged in various forms. Thus, the LED may be used for various purposes.

A light-emitting device chip like a LED is mounted in a metal lead frame and a mold frame through a packaging operation to be manufactured as a semiconductor.

SUMMARY

Provided are light-emitting device packages in which a mold frame and a lead frame are firmly coupled to each other, and methods of manufacturing the light-emitting device packages.

Provided are light-emitting device packages in which a uniform light flux may be maintained, and methods of manufacturing the light-emitting device packages.

Provided are light-emitting device packages in which a mold frame and a lead frame are firmly coupled to each other and a light-emitting efficiency is high, and methods of manufacturing the light-emitting device packages.

Provided are light-emitting device packages in which a mold frame and a lead frame are firmly coupled to each other and the total thicknesses of the light-emitting device packages may be reduced, and methods of manufacturing the light-emitting device packages.

Provided are light-emitting device packages in which deformation of wires connected to a light-emitting chip and risk of breaks of the wires may be reduced, and methods of manufacturing the light-emitting device packages.

Additional aspects will be set forth in part in the description which follows and, in part, will be apparent from the description, or may be learned by practice of the presented embodiments.

According to an aspect of the present invention, a light-emitting device package includes: a lead frame formed of a meal and on which a light-emitting device chip is mounted; and a mold frame coupled to the lead frame by injection molding, wherein the lead frame includes: a mounting portion on which the light-emitting device chip is mounted; and first and second connection portions that are disposed on two sides of the mounting portion in a first direction and connected to the light-emitting device chip by wire bonding, wherein the first connection portion is stepped with respect to the mounting portion, and a stepped amount is less than a material thickness of the lead frame.

The second connection portion is stepped with respect to the mounting portion, and a stepped amount is less than the material thickness of the lead frame.

The light-emitting device package may further include a first reflection portion that reflects light emitted from the light-emitting device chip and is disposed on two sides of the mounting portion in a second direction that is perpendicular to the first direction. An inclination angle of the first reflection portion to the mounting portion may be from about 30 to about 60 degrees. A height of the first reflection portion may be from about 0.5 to about 1.5 times the material thickness of the lead frame. A length of the first reflection portion in the first direction may be longer than a length of the light-emitting device chip.

The mounting portion may be rectangular, and the second direction is a short axis direction. The mold frame may include a second reflection portion that reflects light emitted from the light-emitting device chip and is disposed on two sides of the mounting portion in the first direction. The mold frame may be formed of a liquid crystal polymer (LCP).

According to another aspect of the present invention, a light-emitting device package includes: a light-emitting device chip; a mounting portion that is rectangular and on which the light-emitting device chip is mounted; a first reflection portion that is made of a metal and disposed on two sides of the mounting portion in a short axis direction and reflects light emitted from the light-emitting device chip; and a second reflection portion that is made of a metal and is disposed on two sides of the mounting portion in a long axis direction and reflects light emitted from the light-emitting device chip.

An inclination angle of the first reflection portion to the mounting portion may be from about 30 to about 60 degrees.

A height of the first reflection portion may be from about 0.5 to about 1.5 times a thickness of the mounting portion.

The length of the first reflection portion along the long axis may be longer than a length of the light-emitting device chip.

The mold may be formed of a liquid crystal polymer (LCP).

The light-emitting device package may further include first and second connection portions that are disposed on two sides of the mounting portion in a short axis direction and connected to the light-emitting device chip by wire bonding, wherein at least one of the first and second connection portions is spaced apart from the mounting portion in the long axis direction, and is stepped with respect to the mounting portion, and a stepped amount is equal to or less than a material thickness of the lead frame.

According to another aspect of the present invention, a method of manufacturing a light-emitting device package, includes: forming a lead frame by processing a metal plate, the lead frame including a mounting portion, first and second connection portions that are disposed on two sides of the mounting portion in a first direction and respectively connected to the metal plate via first and second support arms, and a first reflection surface that is extended from two boundaries of the mounting portion in a second direction that is perpendicular to the first direction and is connected to the metal plate via a third support arm; forming a mold frame by performing an injection molding process to a polymer on the lead frame to couple the lead frame and the mold frame to each other, wherein the mold frame includes a second reflection surface disposed on two sides of the mounting portion in the first direction; mounting a light-emitting device chip on the mounting portion; and electrically connecting the light-emitting device chip and the first and second connection portion by wire bonding after cutting the first and second support arms.

The method may further include: filling an upper portion of the light-emitting chip with a transmissive filler to form a light-emitting device package; and separating the light-emitting device package from the metal plate by cutting the third support arm.

The polymer may include a liquid crystal polymer (LCP). The light-emitting device package may be rectangular, and the second direction may be a short axis direction.

At least one of the first and second connection portions may be spaced apart from the mounting portion. At least one of the first and second connection portions may be stepped upward with respect to the mounting portion. A stepped amount may be equal to or less than a material thickness of the lead frame. An inclination angle of the first reflection portion to the mounting portion may be from about 30 to about 60 degrees. A height of the first reflection portion may be from about 0.5 to about 1.5 times a material thickness of the lead frame. A length of the first reflection portion in the first direction may be longer than a length of the light-emitting device chip.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
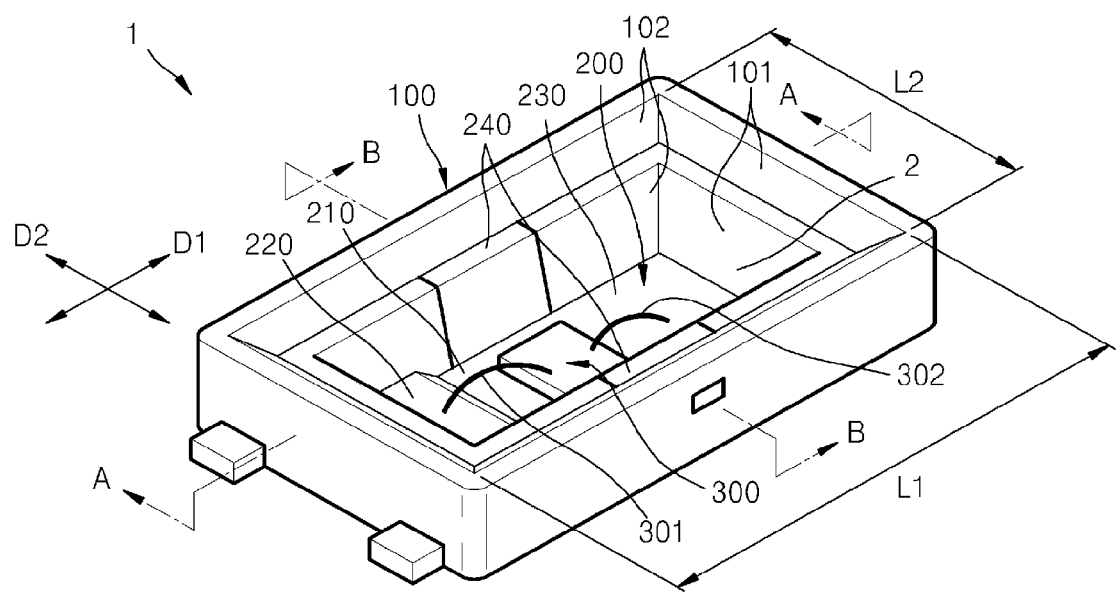
FIG. 1 is a perspective view illustrating a light-emitting device package according to an embodiment of the present invention.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description.

Figure 2:
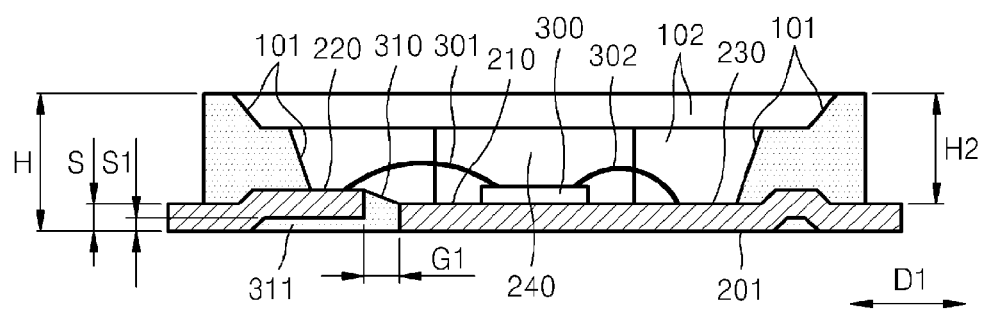
FIG. 2 is a cross-sectional view of the light-emitting device package of FIG. 1, cut along a line A-A, according to an embodiment of the present invention.
Figure 3:
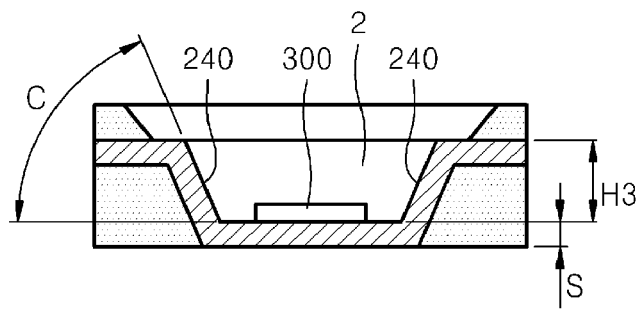
FIG. 3 is a cross-sectional view of the light-emitting device package of FIG. 1, cut along a line B-B, according to an embodiment of the present invention.

FIG. 1 is a perspective view illustrating a light-emitting device package 1 according to an embodiment of the present invention. FIG. 2 is a cross-sectional view of the light-emitting device package 1 of FIG. 1, cut along a line A-A, according to an embodiment of the present invention. FIG. 3 is a cross-sectional view of the light-emitting device package 1 of FIG. 1, cut along a line B-B, according to an embodiment of the present invention.

Referring to FIGS. 1 through 3, the light-emitting device package 1 includes a mold frame 100 and a lead frame 200 formed of a metal. A light-emitting device chip 300 is mounted in the lead frame 200.

The light-emitting device chip 300 may be a light-emitting diode chip. The light-emitting diode chip may emit blue, green, or red color light according to the material of a compound semiconductor of which the light-emitting diode chip is formed. Also, a surface of the light-emitting diode chip may be coated with a fluorescent material so as to emit white light. For example, a blue light-emitting diode chip may include an active layer having a plurality of quantum well layers that are formed by alternately stacking GaN and InGaN, and a P-type clad layer and an N-type clad layer formed of a compound semiconductor of $Al_xGa_yN_z$ may be formed respectively on and under the active layer. In the current embodiment, a light-emitting diode chip is used as the light-emitting device chip 300 but the embodiment of the present invention is not limited thereto. For example, the light-emitting device chip 300 may be a UV photodiode chip, a laser diode chip, an organic light-emitting diode chip, or the like.

The lead frame 200 includes a mounting portion 210 on which the light-emitting device chip 300 is mounted, first and second connection portions 220 and 230 that are electrically connected to the light-emitting device chip 300 by wire bonding, and a first reflection portion 240 reflecting light that is emitted by the light-emitting device chip 300 to emit the light out of the light-emitting device package 1. The first and second connection portions 220 and 230 are located on two sides of the mounting portion 210 in a first direction D1. For example, the first and second connection portions 220 and 230 may be connected to a cathode electrode and an anode electrode of the light-emitting device chip 300 via wires 301 and 302, respectively. The first and second connection portions 220 and 230 are exposed out of the mold frame 100 and function as terminals that supply a current to the light-emitting device chip 300. The first reflection portion 240 is located along a second direction D2 that is perpendicular to the first direction D1. The lead frame 200 may be manufactured by pressing or etching a metal plate such as aluminum, copper, or the like.

The mold frame 100 may be coupled to the lead frame 200 using, for example, an insert injection molding method. The mold frame 100 may be formed of, for example, an electrical insulating polymer. The mold frame 100 is formed to have a cavity form in which the mounting portion 210, the first and second connection portions 220 and 230, and the first reflection portion 240 are exposed. The mold frame 100 includes a second reflection portion 101 that reflects light emitted from the light-emitting device chip 300 so as to be emitted from the light-emitting device package 1. The second reflection portion 101 is disposed on two sides of the mounting portion 210 along the first direction D1. In addition, an inner side 102 of the mold frame 100 in the second direction D2, except the first reflection portion 240, functions as a reflection portion for reflecting light. Accordingly, in the light-emitting device package 1, the light-emitting device chip 300 is disposed on a lower surface of a cavity 2 that is entirely concave, and the first reflection portion 240 corresponding to an inner side of the cavity 2 and the inner side 102 function as a reflection portion that reflects light so as to emit the light out of the light-emitting device package 1. A lower surface of the mounting portion 210 and the first and second connection portions 220 and 230 of the lead frame 200 may be exposed downward from the mold frame 100 and function as a heat radiation surface.

As described above, the light-emitting device package 1 is manufactured by coupling the mold frame 100 to the lead frame 200, and electrically connecting the light-emitting device chip 300 and the first and second connection portions 220 and 230 by wire bonding, and then by encapsulating the cavity 2 by filling the same with a transmissive filler such as silicon. According to necessity, an upper portion or upper and lateral portions of the light-emitting device chip 300 may be coated with a fluorescent material before filling a filler.

In order to increase a coupling intensity between the lead frame 200 and the mold frame 100, the first connection portion 220 and/or the second connection portion 230 are separably formed from the mounting portion 210 and a polymer may be filled in a gap between the first and second connection portions 220 and 230. Referring to FIG. 2, the first connection portion 220 is disposed apart from the mounting portion 210 by a gap G1. Also, the first connection portion 220 is stepped upward from the mounting portion 210. Accordingly, polymer, which is the material of the mold frame 100, is filled up to an inner portion 310 corresponding to the gap G1 and a stepped space 311 under the first connection portion 220, thereby coupling the lead frame 200 and the mold frame 100 more firmly.

A length of the wire 301 needs to be longer than a distance between the cathode electrode of the light-emitting device chip 300 and the first connection portion 220, and the wire 301 curves in an upward direction. When the first connection portion 220 is stepped upward from the mounting portion 210, a tip of the curve portion of the wire 301 is further raised. A thickness H of the light-emitting device package 1 needs to be thick enough to completely accommodate the wire 301 within the light-emitting device package 1. The greater a stepped amount S1 of the first connection portion 220 with respect to the mounting portion 210, the thicker the thickness H of the light-emitting device package 1 and the higher a height H2 from the mounting portion 210 to an upper portion of the light-emitting device package 1. The higher the height H2, the lower the light-emitting efficiency of light emitted from the light-emitting device chip 300.

Table 1 shows results of analyzing a relationship between a light flux and the height H2 from the mounting portion 210 to the upper portion of the light-emitting device package 1. L1 and L2 refer to a long axis and a short axis of the rectangular light-emitting device package 1, and H refers to the total height of the light-emitting device package 1. FL refers to a ratio of emissive light flux to a reference light flux. Here, light flux of Sample No. 1 is set as the reference light flux.

TABLE 1

| No | L1 (mm) | L2 (mm) | H (mm) | H2 (mm) | FL (%) |
| --- | --- | --- | --- | --- | --- |
| 1 (ref) | 4 | 2 | 0.85 | 0.55 | 100 |
| 2 | 3 | 2 | 0.85 | 0.55 | 97.1 |
| 3 | 4 | 1.8 | 0.85 | 0.55 | 97.9 |
| 4 | 3 | 1.8 | 0.85 | 0.55 | 95.1 |
| 5 | 4 | 2 | 1 | 0.7 | 98.9 |
| 6 | 3 | 1.8 | 1 | 0.7 | 93.1 |

Comparing Samples 1 and 5 and Samples 4 and 6 of Table 1, when the long axis L1 and the short axis L2 are the same, the lower the height H2 from the mounting portion 210 to the upper portion of the light-emitting device package 1, more light flux is emitted.

According to the current embodiment of the present invention, the stepped amount S1 of the first connection portion 220 with respect to the mounting portion 210 is equal to or less than a material thickness S of the lead frame 200. For example, when the stepped amount S1 is half of the material thickness S, a height of the wire 301 may be smaller than when the stepped amount S1 is the same as the material thickness S. As described above, by adjusting the stepped amount S1 of the first connection portion 220 to be less than the material thickness S1 of the lead frame 200 and firmly coupling the lead frame 200 and the mold frame 100, the total height H of the light-emitting device package 1 may be reduced and the light-emitting efficiency may be improved.

Figure 4:
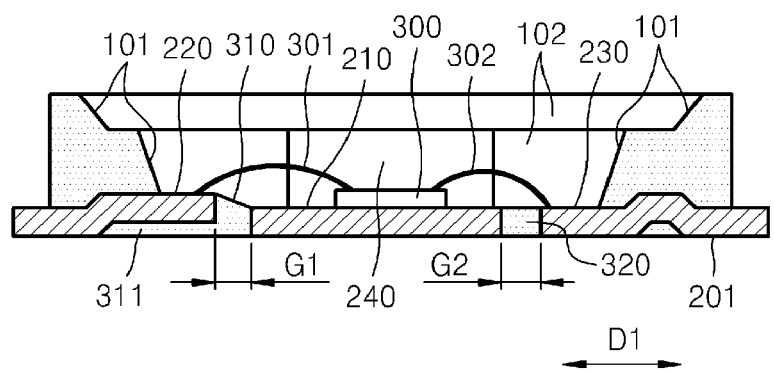
FIG. 4 is a cross-sectional view illustrating a light-emitting device package according to another embodiment of the present invention.

Referring to FIG. 4, the second connection portion 230 may be spaced apart from the mounting portion 210 in the first direction D1 by a gap G2. According to the above-described configuration, a polymer, which the mold frame 100 is formed of, is filled in an inner portion 320 of the gap G2 as illustrated in FIG. 4, thereby coupling the lead frame 200 and the mold frame 100 more firmly.

Figure 5:
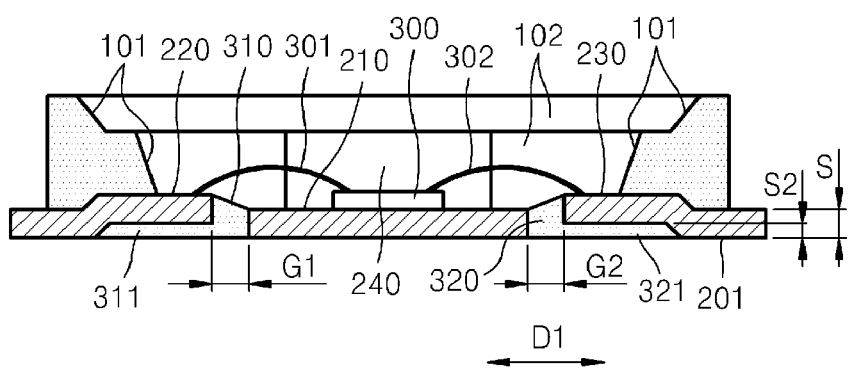
FIG. 5 is a cross-sectional view illustrating a light-emitting device package according to another embodiment of the present invention.

Referring to FIG. 5, the second connection portion 230 is spaced apart from the mounting portion 210 in the first direction D1 by the gap G2, and may be stepped upward with respect to the mounting portion 210. According to the above-described configuration, the polymer of the mold frame 100 may be filled in the inner portion 320 of the gap G2 and a stepped space 321 under the second connection portion 230 so that the lead frame 200 and the mold frame 100 may be coupled to each other more firmly. In order to reduce space occupied by the wire 302, a stepped amount S2 of the second connection portion 230 may be adjusted to be less than a material thickness S of the lead frame 200.

Light emitted from the light-emitting device chip 300 is reflected by the first and second reflection portions 240 and 101 and the inner side 102 along the second direction D2, except the first and second reflection portions 240 of the mold frame 100, and is emitted out of the light-emitting device package 1. The polymer, which the mold frame 100 is formed of, discolors if continuously exposed to light and heat irradiated from the light-emitting device chip 300, and may change chromaticity of light that is being reflected, thereby degrading light quality.

Comparing Samples 1 and 3 and Samples 2 and 4 of Table 1, respectively, when the long axis L1 and the height H2 from the mounting portion 210 to the upper portion of the light-emitting device package 1 are the same, the shorter the short axis L2, the more light flux is emitted. This indicates that more light flux may be incident on an inner side of the light-emitting device package 1 in a short axis direction.

According to the current embodiment, a portion of the inner side of the rectangular light-emitting device package 1 that is disposed along the second direction D2 where more light flux is incident due to the proximity to the light-emitting device chip 300 is formed by using the lead frame 200. That is, the first reflection portion 240, which is formed of a metal, is disposed along the short axis direction of the light-emitting device chip 300. Since the first reflection portion 240 is formed of a metal, properties of the first reflection portion 240 such as discoloration change relatively small compared to a polymer. Accordingly, the light-emitting device package 1 capable of emitting light of uniform quality over a long period of time may be implemented.

The first reflection portion 240 may be bent in an upward direction from a boundary of the mounting portion 210 at an angle in the short axis direction. The first reflection portion 240 may have a length that is sufficient to cover a length of the light-emitting device chip 300 in a long axis direction. In other words, a length of the first reflection portion 240 in the long axis direction may be equal to or greater than that of the light-emitting device chip 300 in the long axis direction. An angle to the mounting portion 210 of the first reflection portion 240 may be from about 30 to about 60 degrees. When a height H3 of the first reflection portion 240 is too high, the light-emitting efficiency is rather decreased, and when the height H3 is too low, the reflection effects are reduced. Considering this, the height H3 of the first reflection portion 240 may be set as 0.5 to 1.5 times of the material thickness S of the lead frame 200.

The light-emitting efficiency may also be increased by forming a reflection portion also in the long axis direction of the light-emitting device package 1. When forming a reflection portion by bending the lead frame 200, the lead frame 200 needs to be bent from the first and second connection portions 220 and 230, which makes the structure of the lead frame 200 complicated. According to the light-emitting device package 1, the second reflection portion 101 is formed as a portion of the mold frame 100 on two sides in the long axis direction. Since the second reflection portion 101 is disposed relatively away from the light-emitting device chip 300 compared to the first reflection portion 240 disposed along the short axis direction, the second reflection portion 101 is less affected by light and heat emitted from the light-emitting device chip 300. Also, the inner side 102 of the mold frame 100 in the short axis direction is also disposed away from the light-emitting device chip 300 and thus is less affected by light and heat emitted from the light-emitting device chip 300. By forming the mold frame 100 using a liquid crystal polymer (LCP), which is resistant to heat, deterioration of light quality due to discoloration of the inner side 102 of the mold frame 100 in the short axis direction and the second reflection portion 101 may be reduced.

Hereinafter, a method of manufacturing a light-emitting device package according to an embodiment of the present invention will be described.

(1) Molding of Lead Frame

Figure 6:
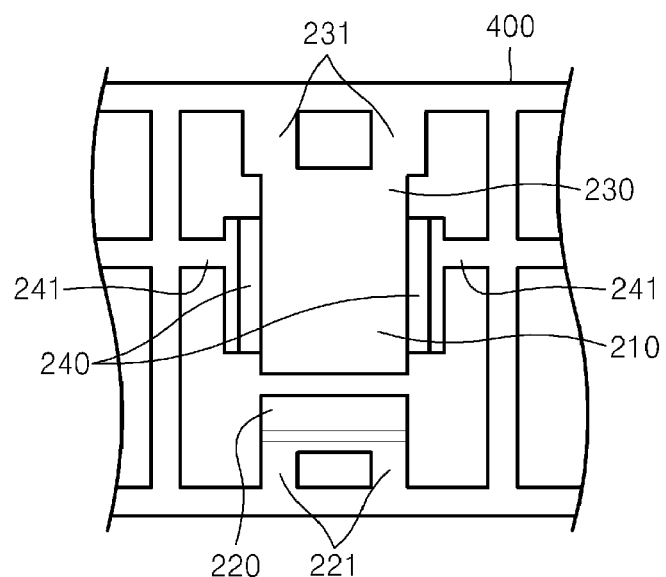
FIG. 6 is a plan view illustrating a method of forming a lead frame from a metal plate, according to an embodiment of the present invention.

Referring to FIG. 6, a metal plate 400 such as aluminum or copper is pressed or etched, etc. to form the mounting portion 210, the first and second connection portions 220 and 230, and the first reflection portion 240.

The first reflection portion 240 is formed by bending the molding portion 210 up about a boundary thereof along the first direction D1 at an angle in an upward direction. As described above, a length of the first reflection portion 240 in a long axis direction may be equal to or greater than a length of the light-emitting device chip 300 in the long axis direction. An inclination angle (C in FIG. 3) of the first reflection portion 240 with respect to the mounting portion 210 may be 30 to 60 degrees, and the height H3 of the first reflection portion 240 may be set as 0.5 to 1.5 times of the material thickness S1 of the lead frame 200.

As illustrated in FIG. 2, the first connection portion 220 may be spaced apart from the mounting portion 210 in the first direction D1 by the gap G1. Also, the first connection portion 220 may be stepped with respect to the mounting portion 210 by an amount corresponding to the material thickness S or less of the lead frame 200.

The second connection portion 230 is disposed opposite to the first connection portion 220 with the mounting portion 210 therebetween. As illustrated in FIG. 2, the second connection portion 220 may be formed by extending from the mounting portion 210. Alternatively, the second connection portion 220 may be spaced apart from the mounting portion 210 by the gap G2, as illustrated in FIG. 4. Alternatively, the second connection portion 220 may be stepped with respect to the mounting portion 210 by an amount corresponding to the material thickness S of the lead frame 200 or less as illustrated in FIG. 5.

In order to maintain the lead frame 200 connected to the metal plate 400 before performing an injection molding process which will be described below, the first and second connection portions 220 and 230 are formed so as to be connected to the metal plate 400 via first and second support arms 221 and 231, respectively. The first reflection portion 240 is connected to the metal plate 400 via a third support arm 241. A washing operation for removing foreign materials from the lead frame 200 may be performed before an injection molding process. In addition, a plating operation may be performed for surface treatment of the lead frame 200.

(2) Molding a Mold Frame

Figure 7:
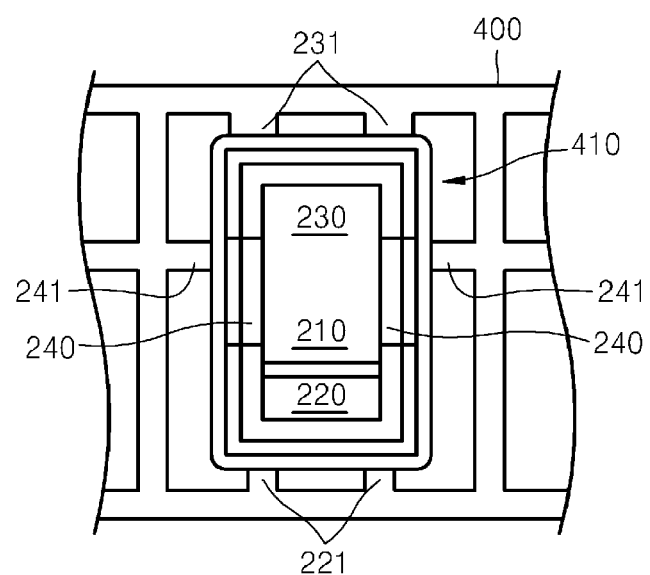
FIG. 7 is a plan view illustrating a lead frame to which a mold frame is coupled, according to an embodiment of the present invention.

Next, the mold frame 100 is coupled to the lead frame 200. The mold frame 100 may be formed by performing injection molding such as an insert injection molding operation to a polymer such as phenyl propanol amide (PPA), a liquid crystal polymer (LCP), or the like. When LCP is used as a polymer, discoloration possibilities due to light and heat emitted from the light-emitting device chip 300 may be reduced as much as possible to maintain a uniform light quality. For example, the metal plate 400 on which the lead frame 200 is formed is inserted into a mold having a structure in which a form of the mold frame 100 illustrated in FIGS. 1 through 5 is engraved and the mounting portion 210, the first and second connection portions 220 and 230, and the first reflection portion 240 may be exposed, and a polymer is injected into the mold and solidified. Then, as illustrated in FIG. 7, a coupled structure 410 in which the mold frame 100 is coupled to the lead frame 200 is manufactured. Since the first through third support arms 221, 231, and 241 are connected to the metal plate 400 through the mold frame 100, the coupled structure 410 is also connected to the metal plate 400.

(3) First Trimming

Figure 8:
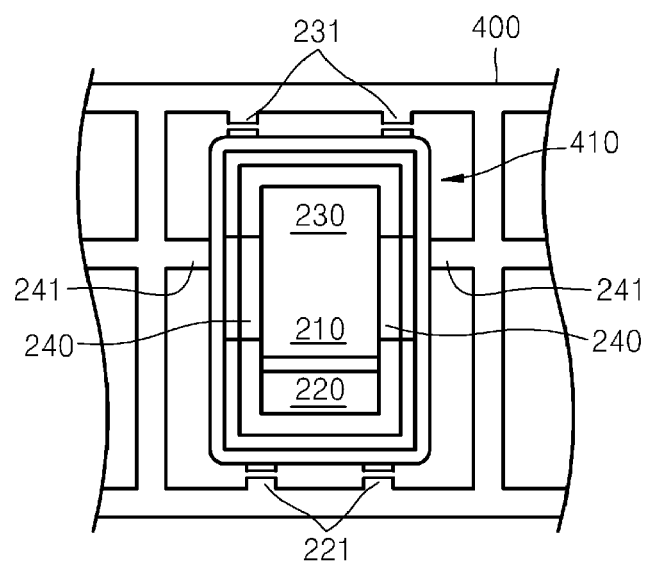
FIG. 8 is a plan view illustrating first and second support arms, which connect first and second connection portions and a metal plate, that are cut, according to an embodiment of the present invention.

Next, a first trimming operation is performed. As illustrated in FIG. 8, the first and second support arms 221 and 231 respectively connecting the first and second connection portions 220 and 230 to the metal plate 400 are cut to separate the first and second connection portions 220 and 230 from the metal plate 400. The third support arm 241 is connected to the metal plate 400, and thus the coupled structure 410 is still connected to the metal plate 400.

(4) Mounting and Wire Bonding of Light-Emitting Device Chip

Figure 9:
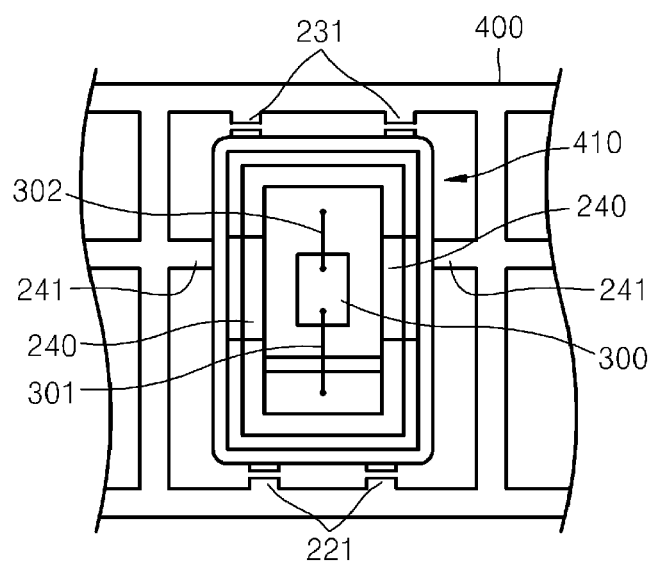
FIG. 9 is a plan view illustrating a light-emitting device package in which a light-emitting device chip is mounted in a mounting portion and a wire bonding operation is performed, according to an embodiment of the present invention.

Next, as illustrated in FIG. 9, the light-emitting device chip 300 is mounted in the mounting portion 210. The light-emitting device chip 300 may be attached to the mounting portion 210 using, for example, an adhesive. Then, the wires 301 and 302 are used to respectively connect the first and second connection portions 220 and 230 to a cathode electrode and an anode electrode of the light-emitting device chip 300.

(5) Filling Operation

Figure 10:
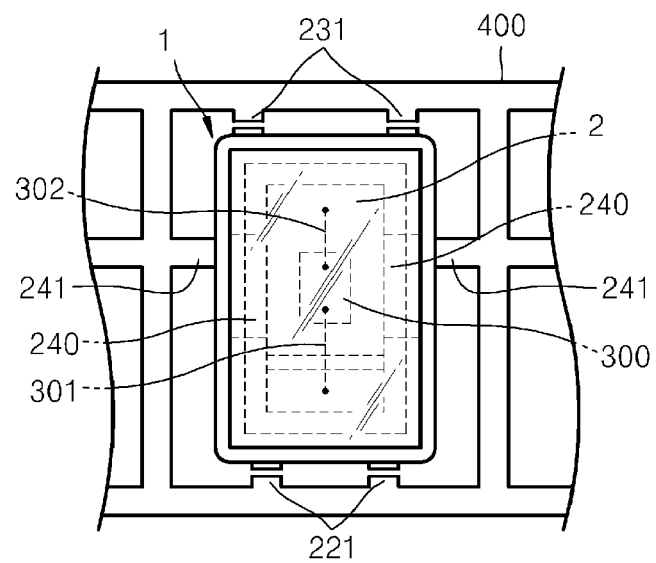
FIG. 10 is a plan view illustrating a cavity of a light-emitting device package in which a filler is filled, according to an embodiment of the present invention.

Next, as illustrated in FIG. 10, an encapsulation operation of filling the cavity 2 with a transmissive filler such as silicon may be performed. According to necessity, an upper portion or upper and lateral portions of the light-emitting device chip 300 may be coated with a fluorescent material before filling the filler. Alternatively and obviously, the light-emitting device chip 300, an upper portion or upper and lateral portions of which are coated with a fluorescent material in advance, may be mounted in the mounting portion 210.

(6) Separation

Figure 11:
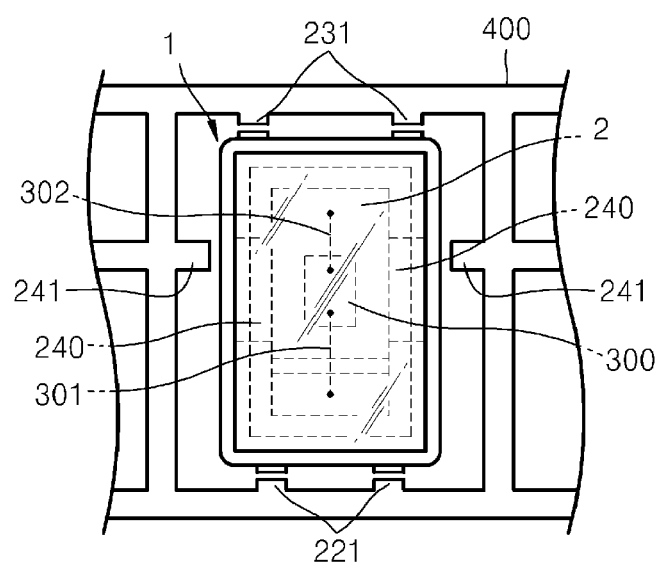
FIG. 11 is a plan view illustrating a light-emitting device package separated from the metal plate by cutting a third support arm, according to an embodiment of the present invention.

Next, as illustrated in FIG. 11, the light-emitting device package 1 is separated from the metal plate 400 by cutting the third support arm 241 to complete the manufacture of the light-emitting device package 1.

In the first trimming operation, stress applied to the first and second support arms 221 and 231 may be transferred to the mold frame 100 and the lead frame 200. Since the first and second support arms 221 and 231, which are disposed in the same direction as a wire bonding direction, that is, in the long axis direction, are cut in the first trimming operation, the mold frame 100 and the lead frame 200 may deform in the long axis direction temporarily and/or permanently by the stress applied to the first and second support arms 221 and 231. When the first trimming operation of separating the first and second connection portions 220 and 230 from the metal plate 400 is performed after wire bonding, the wires 301 and 302 may deform or break due to deformation of the mold frame 100 and the lead frame 200 in the long axis direction. In particular, when the first and second connection portions 220 and 230 are respectively spaced apart from the mounting portion 210 by the gaps G1 and G2, the first and second connection portions 220 and 230 are more likely to deform in the first trimming operation, and the possibilities of deformation or break of the wires 301 and 302 may further increase. Thus, in the method of manufacturing a light-emitting device package, according to the current embodiment of the present invention, the first trimming operation of separating the first and second connection portions 220 and 230 from the metal plate 400 is performed before performing a wire bonding operation.

A second trimming operation of cutting the third support arm 241 after the wire bonding operation is an operation of cutting the third support arm 241 disposed in the short axis direction, which is a direction perpendicular to the wire bonding direction. Thus, even when the mold frame 100 and the lead frame 200 partially deform, the deformation affects the wires 301 and 302 less than in the first trimming operation.

As described above, in the method of manufacturing a light-emitting device package, according to the current embodiment of the present invention, a trimming operation of separating the light-emitting device package 1 from the metal plate 400 is divided into the first trimming operation and the second trimming operation. The first trimming operation of cutting the first and second support arms 221 and 231 in the same direction as the wire bonding direction is performed before a wire bonding operation, and the second trimming operation of cutting the third support arm 241 in a direction perpendicular to the wire bonding direction is performed after a wire bonding operation. Accordingly, the possibilities of deformation or break of the wires 301 and 302 in the trimming operations may be reduced.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. A method of manufacturing a light-emitting device package, the method comprising:
    forming a lead frame by processing a metal plate, the lead frame comprising a mounting portion, first and second connection portions that are disposed on two sides of the mounting portion in a first direction and respectively connected to the metal plate via first and second support arms, and a first reflection surface that is extended from two boundaries of the mounting portion in a second direction that is perpendicular to the first direction and is connected to the metal plate via a third support arm;
    forming a mold frame by performing an injection molding process to a polymer on the lead frame to couple the lead frame and the mold frame to each other, wherein the mold frame comprises a second reflection surface disposed on two sides of the mounting portion in the first direction;
    mounting a light-emitting device chip on the mounting portion; and
    electrically connecting the light-emitting device chip and the first and second connection portions by wire bonding after cutting the first and second support arms.

2. The method of claim 1, further comprising:
    filling an upper portion of the light-emitting chip with a transmissive filler to form a light-emitting device package; and
    separating the light-emitting device package from the metal plate by cutting the third support arm.

3. The method of claim 1, wherein the polymer comprises a liquid crystal polymer (LCP).

4. The method of claim 1, wherein the light-emitting device package is rectangular, and the second direction is a short axis direction.

5. The method of claim 4, wherein at least one of the first and second connection portions is spaced apart from the mounting portion.

6. The method of claim 5, wherein at least one of the first and second connection portions is stepped upward with respect to the mounting portion.

7. The method of claim 6, wherein a stepped amount is equal to or less than a material thickness of the lead frame.

8. The method of claim 4, wherein an inclination angle of the first reflection portion to the mounting portion is from about 30 degrees to about 60 degrees.

9. The method of claim 8, wherein a height of the first reflection portion is from about 0.5 time to about 1.5 times a material thickness of the lead frame.

10. The method of claim 8, wherein a length of the first reflection portion in the first direction is longer than a length of the light-emitting device chip.

\* \* \* \* \*